United States Patent
Kumar et al.

(10) Patent No.: US 10,205,469 B2
(45) Date of Patent: Feb. 12, 2019

(54) LOW LATENCY SOFT DECODER ARCHITECTURE FOR GENERALIZED PRODUCT CODES

(71) Applicant: SK Hynix Inc., Gyeonggi-do (KR)

(72) Inventors: Naveen Kumar, San Jose, CA (US); Aman Bhatia, San Jose, CA (US); Yi-Min Lin, San Jose, CA (US); Fan Zhang, Fremont, CA (US)

(73) Assignee: SK Hynix Inc., Gyeonggi-do (KR)

( * ) Notice: Subject to any disclaimer, the term of this patent is extended or adjusted under 35 U.S.C. 154(b) by 10 days.

(21) Appl. No.: 15/460,160

(22) Filed: Mar. 15, 2017

(65) Prior Publication Data

US 2018/0048332 A1 Feb. 15, 2018

Related U.S. Application Data

(60) Provisional application No. 62/373,935, filed on Aug. 11, 2016.

(51) Int. Cl.
| | |
|---|---|
| *H03M 13/00* | (2006.01) |
| *H03M 13/29* | (2006.01) |
| *G06F 11/10* | (2006.01) |
| *G11C 29/52* | (2006.01) |
| *H03M 13/37* | (2006.01) |
| *H03M 13/45* | (2006.01) |
| *H03M 13/11* | (2006.01) |

(52) U.S. Cl.
CPC ..... *H03M 13/2927* (2013.01); *G06F 11/1068* (2013.01); *G11C 29/52* (2013.01); *H03M 13/2906* (2013.01); *H03M 13/2909* (2013.01); *H03M 13/2942* (2013.01); *H03M 13/3707* (2013.01); *H03M 13/3746* (2013.01); *H03M 13/453* (2013.01); *H03M 13/6502* (2013.01); *H03M 13/1105* (2013.01); *H03M 13/2957* (2013.01)

(58) Field of Classification Search
CPC ......... H03M 13/2927; H03M 13/2909; H03M 13/6502; G11C 29/52
See application file for complete search history.

(56) References Cited

U.S. PATENT DOCUMENTS

| | | | |
|---|---|---|---|
| 7,627,741 | B2 | 12/2009 | Bhullar |
| 7,724,163 | B2 | 5/2010 | Wong |
| 8,261,170 | B2 | 9/2012 | Yedidia |

(Continued)

*Primary Examiner* — Samir W Rizk

(74) *Attorney, Agent, or Firm* — Kilpatrick Townsend & Stockton LLP

(57) ABSTRACT

Techniques for reducing the latency for decoding product codewords with minimal hardware architecture changes are described. In an example, a system accesses and decodes a generalized product code (GPC) codeword by using at least one of a plurality of Chase decoding procedures available on the system. A first Chase decoding procedure is configured according to first values for a set of decoding parameters. A second Chase decoding procedure is configured according to second values for the set of decoding parameters. The second values are different from the first values. The first Chase decoding procedure has a smaller latency and a higher bit error rate (BER) relative to the second Chase decoding procedure based on the first values and the second values for the set of decoding parameters.

20 Claims, 9 Drawing Sheets

(56) References Cited

U.S. PATENT DOCUMENTS

2015/0149873 A1* 5/2015 Cai .................... H03M 13/458
714/773
2016/0182087 A1* 6/2016 Sommer ............ H03M 13/1148
714/752

* cited by examiner

LOW LATENCY SOFT DECODER ARCHITECTURE FOR GENERALIZED PRODUCT CODES

CROSS-REFERENCES TO RELATED APPLICATIONS

The present application claims priority to U.S. Provisional Application No. 62/373,935, entitled "Low Latency Soft Decoder Architecture for Generalized Product Codes," filed Aug. 11, 2016, commonly owned and expressly incorporated by reference herein in its entirety.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND

In NAND flash storage, the most widely used advanced error control coding techniques are based on low density parity check (LDPC) codes and Bose-Chaudhuri-Hocquenghem (BCH) codes. Although BCH codes have hardware friendly implementation, they can be unattractive due to lack of soft decoding support when several NAND reads are used to generate the soft information. LDPC soft decoder provides significant performance gains. However, the LDPC decoder has a large System on a Chip (SoC) area and consumes relatively more power.

Given the shortcomings of LDPC and BCH codes, a class of codes has been developed, where these codes can support soft decision decoding with a smaller SoC area and smaller power consumption. These codes include product codes. U.S. Pat. No. 9,231,623, entitled "Chase Decoding for Turbo-Product Codes (TPC) Using Error Intersections," filed Mar. 26, 2014, U.S. patent application Ser. No. 15/158, 425, entitled "Generalized Product Codes For NAND Flash Storage," filed May 18, 2016, and U.S. patent application Ser. No. 15/460,155, filed Mar. 15, 2017, entitled "Soft Decoder for Generalized Product Codes," all of which are commonly assigned and expressly incorporated by reference herein in their entirety, describe examples of such codes and decoding thereof.

Product codes can provide significant performance gains in hard decision decoding with much lesser SoC area and power compared to LDPC codes. In U.S. patent application Ser. No. 15/460,155, filed Mar. 15, 2017, entitled "Soft Decoder for Generalized Product Codes," a soft decoder architecture is described. This architecture provides soft decoding performance close to LDPC codes. In addition to SoC area and power benefits, Product codes are competitive in throughput compared to LDPC codes.

However, latency of the soft decoder of generalized product codes (GPC) can be quite high compared to the LDPC soft decoder. In U.S. patent application Ser. No. 15/158,416, entitled "Performance Optimization In Soft Decoding For Turbo Product Codes," filed May 18, 2016, which is commonly assigned and expressly incorporated by reference herein in its entirety, an early termination algorithm for Chase decoding is described. The early termination algorithm can reduce latency of the soft decoder. Although this latency reduction is significant, the LDPC decoder remains a faster soft decoder.

Many product applications can be latency sensitive with respect to hard and/or soft decision decoding. For example, and in order to make the GPC solution viable for mobile, client and enterprise applications, significant reduction in soft decoder latency is further needed.

BRIEF SUMMARY

Techniques for codeword decoding are described. The techniques can be implemented within a system and reduce the overall decoding latency of the system without a significant impact to the bit error rate (BER) performance. In an example, the multiple Chase decoding procedures are available on the system. For example, each Chase decoding procedure is implemented by a soft decoder of the system. Generally, the Chase decoding procedures use the same decoding algorithm to decode GPC codewords. Accordingly, the Chase decoding procedures share a common set of decoding parameters. However, the values of the decoding parameters vary across the different Chase decoding procedures. In particular, the values are set for each Chase decoding procedure to achieve a particular decoding latency for that procedure. For instance, first values may be used for a first Chase decoding procedure and second, different values may be used for a second Chase decoding procedure. Based on these values, the first Chase decoding procedure can have a better decoding latency (e.g., a smaller one), but a worse BER (e.g., a higher one) relative to the second Chase decoding procedure. The system uses at least one of the Chase decoding procedures to decode GPC codewords.

In an example, the soft decoders are connected in series. The first Chase decoding procedure in the series can have the fastest decoding latency, but the worst BER. In comparison, the last Chase decoding procedure in the series can have the slowest decoding latency, but the best BER. A GPC codeword is input to the first soft decoder. Only if a decoding failure occurs at that decoder, the GPC codeword becomes input to the next soft decoder in the series, and so on and so forth.

In an example, the soft decoders are provided in parallel. Information about the BER is available at the time of decoding. A mapping is also available, where the mapping associates the soft decoders with BER ranges. A comparison of the BER to the BER ranges is made and one of the soft decoder is selected. A GPC codeword is input to the selected soft decoder for decoding.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
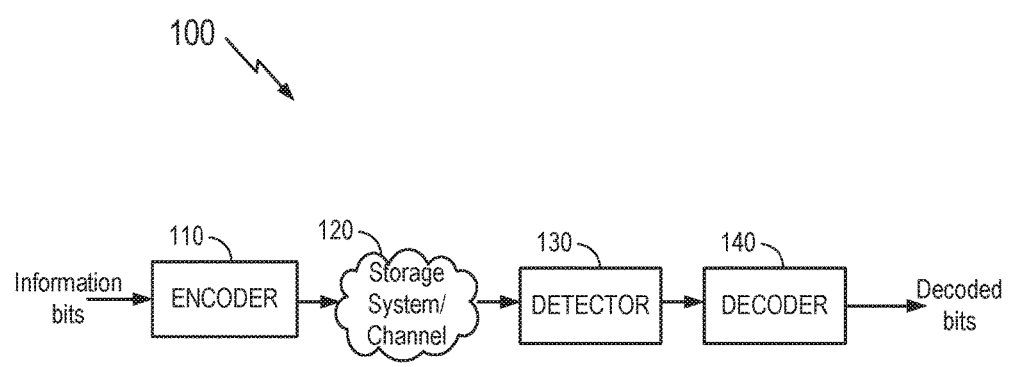
FIG. 1 illustrates an example high level block diagram of an error correcting system, in accordance with certain embodiments of the present disclosure.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications, and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Embodiments of the present disclosure relate to a novel soft decoder architecture that reduces the latency in a desired decoding regime for latency-sensitive product applications. In an example embodiment, a system uses Chase decoding to decode GPC codewords. Multiple Chase decoding procedures are available on the system. Each Chase decoding procedure is configured according to particular values for a set of decoding parameters. This set is common across the Chase decoding procedures. For example, the set includes a first parameter "L" and second parameter "S," in which case Chase decoding can be referred to as Chase (L,S) decoding. The first parameter "L" limits the total number of bits of a GPC codeword available for flipping across multiple flips to correct errors in the decoded codeword. The second parameter "S" limits the total number of the bits available for flipping in a single flip. For instance, in a Chase (4,2) decoding procedure, four bits of a GPC codeword can be flipped, where each time the bits are flipped, a combination of two bits to be flipped should be used. By varying the values of the decoding parameters, each decoding procedure can be optimized for either latency or bit error rate (BER). For example, the smaller the first parameter "L" is, the faster the Chase decoding procedure is (e.g., the smaller its decoding latency is), but the worse its BER is (e.g., the larger the BER is). The system intelligently uses at least one of the Chase decoding procedures to decode a GPC codeword. For instance, the fastest Chase decoding procedure is used (e.g., the ones with the smallest decoding latency). If the resulting BER is acceptable, no additional decoding is needed. Otherwise, another decoding procedure is used. Accordingly, the overall decoding latency of the system is reduced given the intelligent use of the Chase decoding procedures.

To illustrate, the available Chase decoding procedures include a first Chase decoding procedure and a second Chase decoding procedure. The first Chase decoding procedure is configured according to first values of the decoding parameters (e.g., "L" set to six and "S" set to one). A second Chase decoding procedure is configured according to second values of the decoding parameters (e.g., "L" set to twelve and "S" set to five). In this example, the first Chase decoding procedure is faster (e.g., has a relatively smaller latency), but has a worse BER performance (e.g., has a relatively larger BER) than the second one given the values used for the common set of decoding parameters "L" and "S." The system can use the first decoding procedure to decode GPC codewords if the first BER performance is acceptable.

Different techniques are possible to use the available Chase decoding procedures. In one example technique, these procedures are connected in series. The first Chase decoding procedure in the series is generally the fastest, but has the worse BER. Conversely, the last chase decoding procedure in the series is the slowest, but has the best BER. A GPC codeword is input to one of the Chase decoding procedures (e.g., to the first one). If its decoding fails, the GPC codeword is then input to the next connected Chase decoding procedure (e.g., to the second one in the series), and so on and so forth. If the decoding succeeds, the GPC codeword need no longer be an input to the next connected Chase decoding procedure.

In another example technique, the available Chase decoding procedures are set-up in parallel. A mapping is also available on the system (e.g., from memory). This mapping specifies a selection of a particular Chase decoding procedure given a BER range. Accordingly, the system uses a BER estimate and the mapping to select one of the Chase decoding procedure. For instance, the selected procedure has a BER range to which the BER estimate belongs. Thereafter, the system decodes GPC codewords by using the selected Chase decoding procedure.

In the interest of clarity of explanation, the embodiments of the present disclosure are described in connection with GPC codewords and Chase decoding procedures. However, the embodiments are not limited as such and similarly apply to other types of codes, such as turbo produce codes (TPC) and Generalized LDPC (G-LDPC codes), and other types of hard and/or soft decoding procedures. Generally, multiple decoding procedure are available on the system in, for example, series or parallel. These decoding procedure implement a same decoding algorithm and are configured according to a common set of decoding parameters for the execution of the decoding algorithm. The values of the decoding parameters are varied across the decoding procedures to vary the performances. For instance, one set of values for a first decoding procedure is set to optimize latency (e.g., reduce the latency), but can result in a high BER. The values of a second decoding procedure is set to optimize the BER (e.g., reduce the BER), but can result in a high latency. These two decoding procedures can be used in conjunction (whether in series or in parallel) to achieve an overall decoding latency and BER.

The term "error correcting code (ECC)" is used herein to refer to a codeword that is generated by a process of adding redundant data, or parity data, to a message, such that it can be recovered by a receiver even when a number of errors are introduced, either during the process of transmission, or storage. In general, ECC decoding can correct one or more errors up to the capability of the code being used. Error-correcting codes are frequently used in communications, as well as for reliable storage in storage systems such as CDs, DVDs, hard disks, and random access memories (RAMs), flash memories, and the like. Error correcting codes include GPC codes.

The term "hard decision" is used herein to refer to a bit that comprises a "0" or a "1" value, and is associated with a particular location within a codeword. A "hard decision" may also be referred to as a "hard output" or "hard information." In some embodiments, the reliability of each hard decision may be known. The "reliability" of a hard decision refers to a probability (e.g., a value from "0" through "1") that the corresponding hard decision is correct. A "reliability" may also be referred to as "soft information" or a "soft output." In a NAND channel, a reliability for each bit may be obtained, for example, by multiple read operations from the NAND memory using different thresholds. In general, if the hard decision decoding of a codeword fails, soft information can be used to decode the failed codeword using soft decoding techniques, such as Chase decoding.

FIG. 1 illustrates an example high level block diagram of an error correcting system 100, in accordance with certain embodiments of the present disclosure. In the example shown, the system includes 100 an encoder 110, a storage system 120, a detector 130, and a decoder 140. The encoder 110 receives information bits that include data which is desired to be stored in the storage system 120 or transmitted in a communications channel. Encoded data is output by the encoder 110 and is written to the storage system 120. In various embodiments, the storage system 120 may include a variety of storage types or media, such as magnetic disk drive storage, flash storage, etc. In some embodiments, the techniques described herein are employed in a transceiver and instead of being written to or read from storage, the data is transmitted and received over a channel (e.g., wired or wireless). In this case, the errors in the received codeword may be introduced during transmission of the codeword.

When the stored data is requested or otherwise desired (e.g., by an application or a user), the detector 130 receives the data from the storage system 120. The received data may include some noise or errors. The detector 130 performs detection on the received data and outputs decision and/or reliability information corresponding to one or more bits in a codeword. For example, a soft-output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure the detector is in that decision (e.g., a large magnitude indicates a high reliability or certainty).

The decision and/or reliability information is passed to the decoder 140 which performs decoding using the decision and/or reliability information. A soft input decoder utilizes both the decision and the reliability information to decode the codeword. A hard decoder utilizes only the decision values in the decoder to decode the codeword. After decoding, the decoded bits generated by the decoder 140 are passed to the appropriate entity (e.g., the user or application which requested it). With proper encoding and decoding, the information bits match the decoded bits.

The decoder 140 may implement a number of decoding schemes (e.g., decoding algorithms implemented using application-specific integrated circuit (ASIC), a field-programmable gate array (FPGA), and/or a general purpose processor (e.g., an Advanced RISC Machine (ARM) core)) depending on the type of the codeword and whether or not reliability information corresponding to each bit is available.

In an example embodiment, the decoder 140 implements multiple Chase decoding procedures. Each implemented procedure represents a soft decoder. The soft decoders can be connected in series, as further illustrated in FIG. 3, or in parallel, as further illustrated in FIG. 4. U.S. patent application Ser. No. 15/460,155, filed Mar. 15, 2017, entitled "Soft Decoder for Generalized Product Codes," U.S. patent application Ser. No. 15/158,416, entitled "Performance Optimization In Soft Decoding For Turbo Product Codes," filed May 18, 2016, and U.S. patent application Ser. No. 15/431,554, filed Feb. 13, 2017, entitled "Soft Decoder Parameter Optimization For Product codes," all of which are commonly assigned and expressly incorporated by reference herein in their entirety, describe examples of Chase decoding procedures.

Generally in Chase decoding, the least reliable bits (e.g., according to the LLRs of the bits) are flipped and hard decoding is performed multiple times. The outputs of successful hard decoding procedures are sorted according to the Euclidean distance to the received codeword, and the closest codeword is selected as a candidate decoded codeword. This is usually followed by an additional procedure (e.g., miscorrection avoidance thresholding (MAT)) to determine whether the selected candidate codeword (e.g., output of the Chase decoder) is the correct codeword or if it is a miscorrected codeword. In one example, when a miscorrection is declared, no changes are made to the received codeword in that iteration of Chase decoding to avoid adding new errors in the codeword.

In Chase (L) decoding, anytime bits are to be flipped in an attempt to correct errors, only "L" bits are selected and flipped (e.g., the "L" bits that have the smallest LLRs). "L" represents a decoding parameter. Hence, rather than flipping a large number of bits, a smaller number "L" can be flipped. The possible number of bit flips is accordingly reduced to "$2^L-1$." By doing so, the decoding latency is reduced relative to Chase decoding that does not limit the bit flipping according to the "L" parameter.

In Chase (L, S) decoding, anytime bits are to be flipped in an attempt to correct errors, only "L" bits are flipped. Further, when flipping "L" bits, only combinations of "S" bits can be flipped. "S" represents a second decoding parameter. Hence, the number of possible flips is further reduce to ($_S^L$) (e.g., combination of "S" bits from a set of "L" bits). By doing so, the decoding latency is further reduced relative to Chase (L) decoding.

Figure 2A:
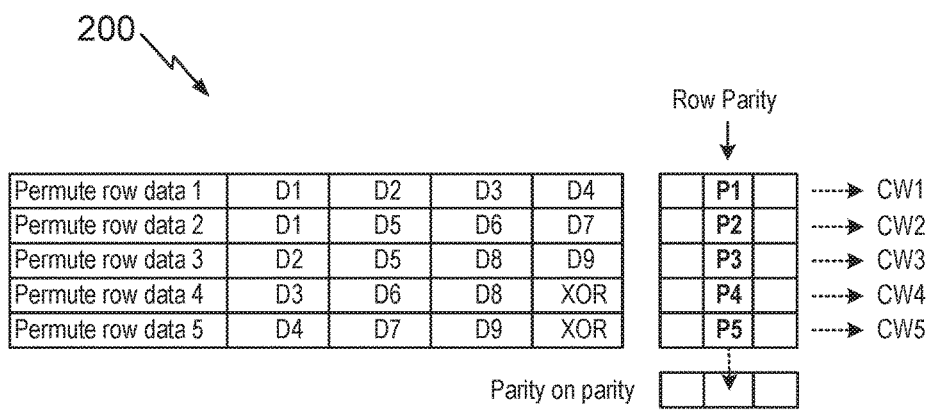
FIG. 2A and FIG. 2B are simplified schematic diagrams illustrating a generalized product code (GPC), in accordance with certain embodiments of the present disclosure.
Figure 2B:
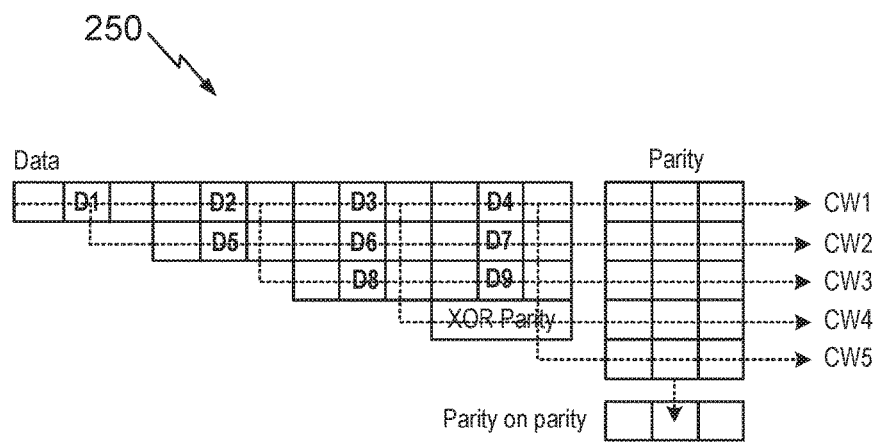

FIG. 2A and FIG. 2B are simplified schematic diagrams illustrating a GPC codeword, in accordance with certain embodiments of the present disclosure. As an example, a GPC code 200 is a product code in which information bits are grouped in blocks, the blocks of information bits and one or more XOR parity blocks is arranged in a rectangular matrix of data blocks. In the example of FIG. 2A, the data blocks of information bits are numbered D1-D9, and each block Dk contains "i" bits, where "i" is a positive integer. Each row of data is permuted and the codeword parity is constructed on the permuted data, which is shown as Row Parity in FIG. 2A. In addition, the parities on the parity (POP) are constructed by combining row parities columnwise. The arrangement is configured to remove miscorrections because the same codeword will not be formed for different rows with changing data locations with permutations. All the data blocks are protected twice, however the row parity is protected once. The parity on parity (POP) will add another level of protection to remove errors in parities.

In FIG. 2B, a specific example is shown to explain the construction of a GPC code 250. However, the construction described here can be used for any class of product codes. For example, in other embodiments, the product code construction can be extended to higher dimensions. In an embodiment, data blocks can be protected three times in a three-dimensional generalized product code.

In FIG. 2B, the number of data bits in a block, "i," is taken as an integer, for example, from eight to sixteen, but it can be any chosen value depending upon desired data length and code rate. Let Ncw be the number of row codewords, which is equal to five in FIG. 2B, i.e., there are five codewords designated as CW1-CW5. The block designated as "XOR" or "XOR parity" is constructed by taking XOR (exclusive OR) of all data blocks of length "i," and the parities of the first (Ncw-1) row codewords. In some embodiments, multiple XOR blocks can be formed, with each XOR block constructed based on a subset of all data blocks of information bits. The length of the "XOR parity" block is also equal to "i." All row parities are further encoded by another constituent code which is called parity on parity or POP. In this code construction, the decoding criterion is such that the data is decoded successfully if all Ncw codewords are decodable and XOR parity check is satisfied. This decoding criterion helps in avoiding miscorrections. In this construction XOR is used to correct stuck patterns.

In this example, it can be seen that every pair of constituent codewords share a common block of data bits with each other. In other words, the same block of data is contained in two codewords. For instance, data block D1 is in both CW1 and CW2, and therefore, CW1 and CW2 share data block D1. Similarly, CW1 and CW3 share data block D2, CW1 and CW4 share data block D3, and CW1 and CW4 share data block D4. Further, CW2 and CW3 share data block D5, CW3 and CW4 share data block D8, and CW4 and CW5 share the XOR data block, etc.

Figure 3:
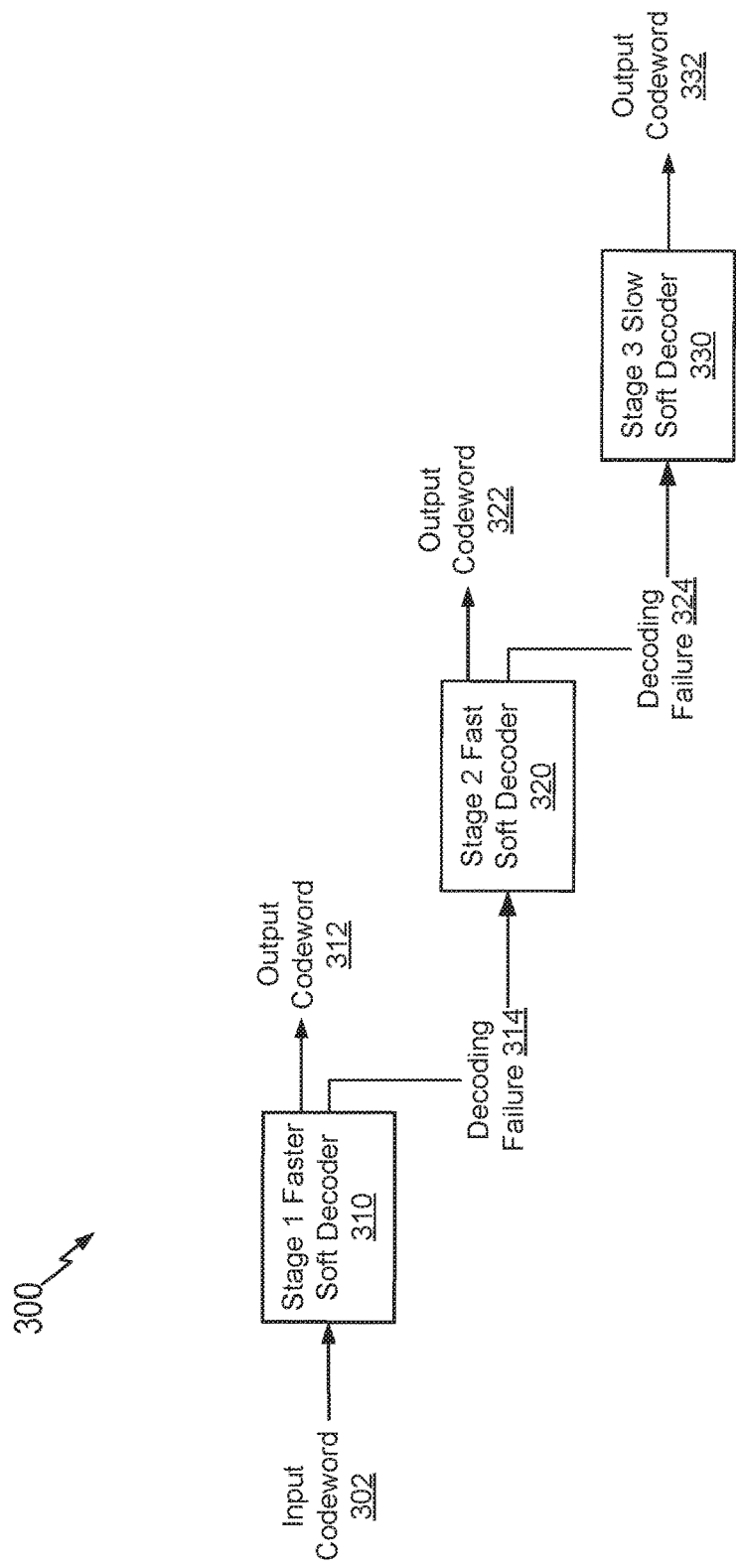
FIG. 3 illustrates an example configuration of a decoder that implements multiple Chase decoding procedures, in accordance with certain embodiments of the present disclosure.

FIG. 3 illustrates an example configuration of a decoder 300 that implements multiple Chase decoding procedures, such as the decoder 140 of FIG. 1, in accordance with certain embodiments of the present disclosure. FIG. 3 illustrates three Chase decoding procedures corresponding to three possible stages for decoding GPC codewords. However, a different number of decoding procedures is possible, whether these procedures are Chase decoding procedures, another type of decoding procedure, or a combination of different types of decoding procedures.

Generally, the Chase decoding procedures are connected in series. In an embodiment, the series connection cascades the Chase decoding procedures where a GPC codeword is input to a particular Chase decoding procedure. On one hand, if the decoding is successful, a decoded codeword is output from the Chase decoding procedure. This output and the GPC codeword need not be used as inputs to any of the remaining Chase decoding procedures. On the other hand, if the decoding fails, the GPC codeword becomes input to the next Chase decoding procedure in the series. For instance, the GPC codeword is an output from the particular, failed Chase decoding procedure and is input to the next Chase decoding procedure.

In the illustrative example of FIG. 3, a stage one faster soft decoder 310 (e.g., one that implements a first Chase decoding procedure) is the first decoder in the series. A stage two fast soft decoder 320 (e.g., one that implements a second Chase decoding procedure) is the second decoder in the series and is connected to the stage one faster soft decoder 310. A stage three slow soft decoder 330 (e.g., one that implements a third Chase decoding procedure) is the last decoder in the series and is connected to the stage two fast soft decoder 320. The three soft decoders 310-330 form the decoder 300. Each of the three decoders 310-330 implements a Chase decoding procedure that uses a set of decoding parameters, such as "L" and "S," that are common across the three decoders 310-330. The values of the parameters are optimized to achieve a desired performance (e.g., latency or BER) at the cost of another type of performance (e.g., BER or latency). Generally, the larger number of bits that can be flipped, the larger the latency is and the smaller the BER is. For instance, the "L" and "S" parameters limit the number of combinations of possible bit flips. The smaller the number of possible bit flips, the faster the Chase decoding procedure becomes, but the worse the BER is.

The overall latency of the system can be expressed as: overall latency=latency of first stage coder+$\Sigma_{i=2}^{N} \text{BER}_{i-1} \times$ (latency of "$i^{th}$" stage decoder), where "i" is an integer and "N" is the number of stages (e.g., "N" is three in the example of FIG. 3). Because the BER at each stage is reduced relative to the previous stage, the overall latency of the system is reduced relative to existing decoding systems.

In addition to the "L" and "S" parameters, other decoding parameters exist and can be used to optimized for performance, such as for latency or BER. For example, the decoding parameters may further include miscorrection avoidance thresholds (MAT) parameters, maximum iteration for soft decoding global loop and maximum number of iterations. It should be noted that the values for "L," "S," and MAT parameters can also change according to iteration numbers. In general, the different decoding parameters are optimized for latency (e.g., to achieve a desired decoding latency) or BER (e.g., such that there is no error floor until the desired code failure rate (CFR)). There is a tradeoff in latency and error floor optimization. Typically, shorter latency optimized parameters have worse error floor. U.S. patent application Ser. No. 15/431,554, filed Feb. 13, 2017, entitled "Soft Decoder Parameter Optimization For Product codes," which is commonly assigned and expressly incorporated by reference herein in its entirety, describes different techniques for setting the values of the decoding parameters to achieve a desired performance.

An input codeword 302, such as a GPC codeword, is input to the stage one faster soft decoder 310. If the decoding using this first procedure is successful, an output codeword 312 is output from the stage one faster soft decoder 310. Otherwise, the input codeword 302 is input to the stage two fast soft decoder 320. Here also, if the decoding using this second procedure is successful, an output codeword 322 is output from the stage two fast soft decoder 320. Otherwise, the input codeword 302 is input to the stage three slow soft decoder 330. Assuming decoding success, an output codeword 332 is output from the stage 3 slow soft decoder 330. Of course, if the decoding using this third procedure failed, a next decoding procedure is used (if one exists) or a decoding failure is declared.

In one particular embodiment, the soft decoder 310 is a Chase (8, 6) decoder. The average latency for this decoder 310 is around sixty microseconds, with an error floor pushed to $1\ e^{-2}$ CFR. In comparison, the soft decoder 320 is a Chase (6, 4) decoder. The average latency for this decoder 320 is around one hundred and twenty-five microseconds, with an error floor pushed to $1\ e^{-5}$ CFR. The soft decoder 330 is a Chase (10, 4) decoder. The average latency for this decoder 330 is around six hundred microseconds, with an error floor pushed to $1\ e^{-11}$ CFR. In this particular embodiment, the three stage architecture has an overall latency of $60+1\ e^{-2} \times 125 + 1\ e^{-5} \times 600 = 61.3$ seconds. Relative to the slowest yet best BER decoder (e.g., the third stage soft decode 330 with a six hundred microsecond latency and $1\ e^{-11}$ CFR), the three stage architecture can make the average latency around ten times faster (e.g., 61.3 microseconds compared to six hundred microseconds) while achieving a similar BER.

Figure 4:
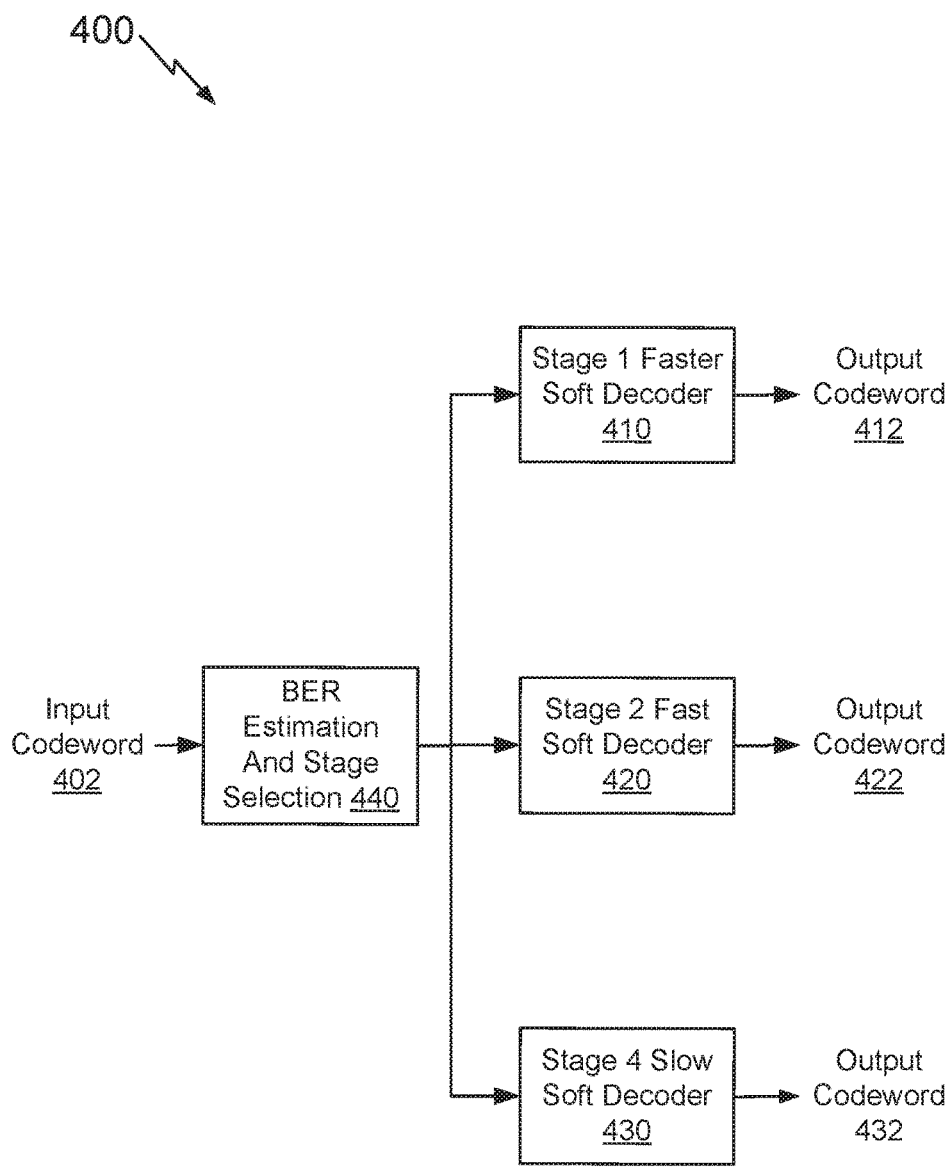
FIG. 4 illustrates another example configuration of a decoder that implements multiple Chase decoding procedures, in accordance with certain embodiments of the present disclosure.

FIG. 4 illustrates another example configuration of a decoder 400 that implements multiple Chase decoding procedures, such as the decoder 140 of FIG. 1, in accordance with certain embodiments of the present disclosure. Here and similarly to FIG. 3, three Chase decoding procedures are used. However, a different number of decoding procedures is also possible. Unlike the configuration of FIG. 3, the three Chase decoding procedures are provided in parallel.

In an embodiment, a GPC codeword is decoded with only one of the available Chase decoding procedures. More specifically, a selection is made for a particular Chase decoding procedure, where the selection depends on a number of factors that relate to noise and/or error. The selected Chase decoding procedure is then used for the decoding. The remaining Chase decoding procedures are not used for the decoding. In an example, the factors include a BER estimate at the time of the decoding and a mapping of the Chase decoding procedures to BER ranges. For instance, if the BER estimate falls within a BER range that corresponds to a particular Chase decoding procedure, that procedure is selected for the decoding.

In the particular embodiment of FIG. 4, the decoder 400 includes three soft decoders that are provided in parallel: a stage one faster soft decoder 410, a stage two fast soft decoder 420, and a stage three slow decoder 440. Each of these decoders implements a Chase decoding procedure. The different Chase decoding procedures share a common set of decoding parameters. However, the values of these parameters vary between the different Chase decoding procedures and are optimized for a desired performance (e.g., latency or BER). The three soft decoders 410, 420, and 430 of FIG. 4 can have the same parameters and the associated values as the three soft decoders 310, 320, and 330, respectively, of FIG. 3.

In addition, the decoder 400 includes a BER estimation and stage selection module 440. This module 400 can be implemented as hardware, or as software or firmware hosted on hardware. The module 440 is configured to select one of the three soft decoders 410, 420, and 430 given some factors about noise and/or error. For instance, if some information on BER is available at the time of decoding, the module 440 uses this information to select a particular soft decoder.

In a particular example, to select a soft decoder (or, equivalently, a Chase decoding procedure), the module 440 uses BER estimate and a mapping of BER ranges to the available soft decoders 410, 420, 430. More specifically, each of the soft decoders 410, 420, 430 operates within a range of BER. For instance, the stage one faster soft decoder 410's range is one to 1 to $1\ e^{-2}$ CFR. The stage two fast soft decoder 420's range is $1\ e^{-2}$ CFR to $1\ e^{-5}$ CFR. The stage three slow soft decoder 430's range is $1\ e^{-5}$ CFR to $1\ e^{-11}$ CFR. The mapping associates each of the soft decoders 410, 420, 430 with one of such ranges. If the BER estimate falls in a particular range, the module 440 selects the soft decoder that is associated with that range.

Figure 8:
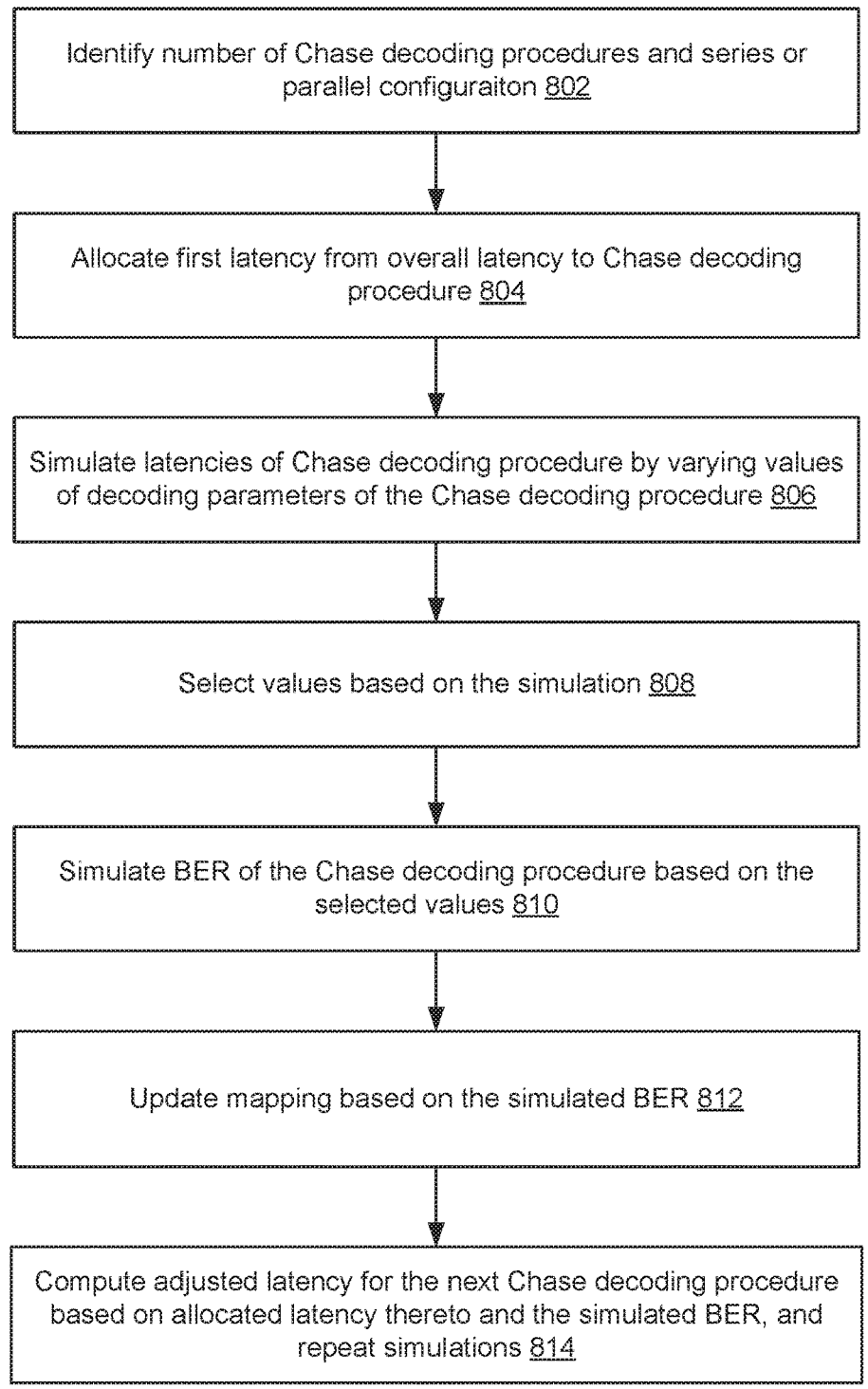
FIG. 8 illustrates an example flow for configuring the system to achieve a desired decoding performance, where the system provides a plurality of decoders, in accordance with certain embodiments of the present disclosure.

The mapping can be developed through simulation, as further illustrated in FIG. 8. Briefly, once the decoding parameters of a soft decoder are set to particular values to achieve, for example, a particular latency performance, the BER performance of the soft decoder is simulated. Given the BER performance simulation, the BER range is derived. The mapping is updated to map this BER range to an identifier of the soft decoder.

Various techniques are also available to determine the BER estimate and should be apparent to one skilled in the art. In one example, the BER estimate is available from memory of a flash storage device from which GPC codewords are read. In another example, the module 440 estimates an observed BER. To do so, the module uses a weight vector "W." This weight vector "W" is available from memory of the system that implements the decoder 400. The weight vector "W" is derived prior to the decoding, such as during a simulation phase. In the simulation phase, training codewords are used during a simulation phase. The training codewords (represented as a matrix "TC") are input to the decoder 400 at known BERs (represented as a vector "B"). The weight vector "W" is the computed, where the product of "TC" and "W" is the BER vector "B." Upon completion of the simulation phase, the weight vector "W" is stored in the memory of the system. Thereafter and upon decoding different codewords (represented as a matrix "DC"), the observed BER is estimated as the product of "DC" and "W."

As illustrated in FIG. 4, an input codeword 402, such as a GPC codeword, is input to the decoder 400. The BER estimation and stage selection module 440 selects one of the three soft decoders 410, 420, or 430 to decode this input codeword 412. Similarly, if the stage two fast soft decoder 420 is selected instead, this second decoder is used for the decoding and outputs an output codeword 422. Likewise, if the stage three slow soft decoder 430 is selected instead of both first two decoders, this third decoder is used for the decoding and outputs an output codeword 432. Here, the latency performance of the decoder 400 is similar to the decoder 300 of FIG. 3 (about 61.3 microseconds) because only the soft decoders 410, 420, and 430 are intelligently selected for the decoding given the available information about BER.

Figure 5:
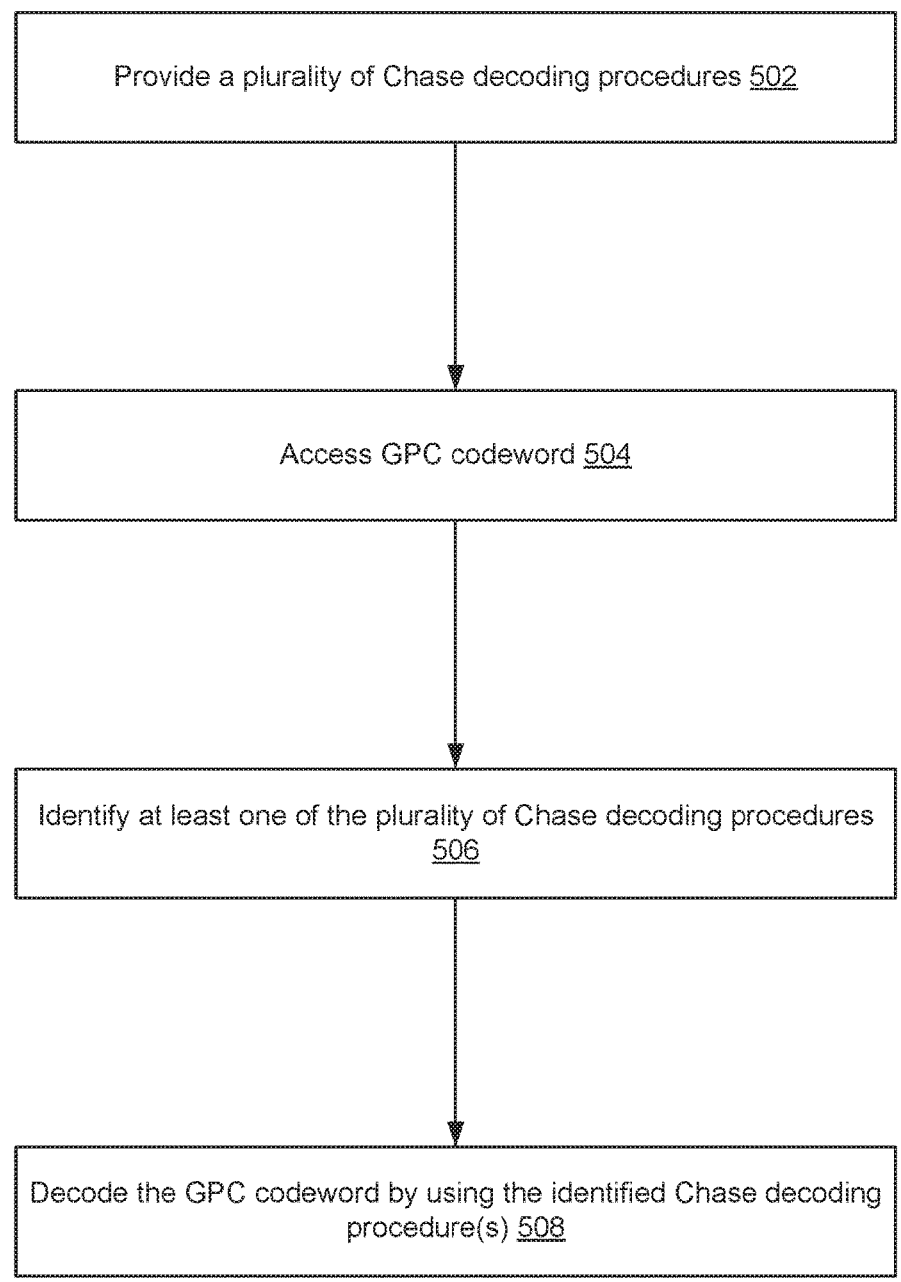
FIG. 5 illustrates an example flow for decoding a codeword based on at least one of a plurality of decoders available on a system, in accordance with certain embodiments of the present disclosure.
Figure 6:
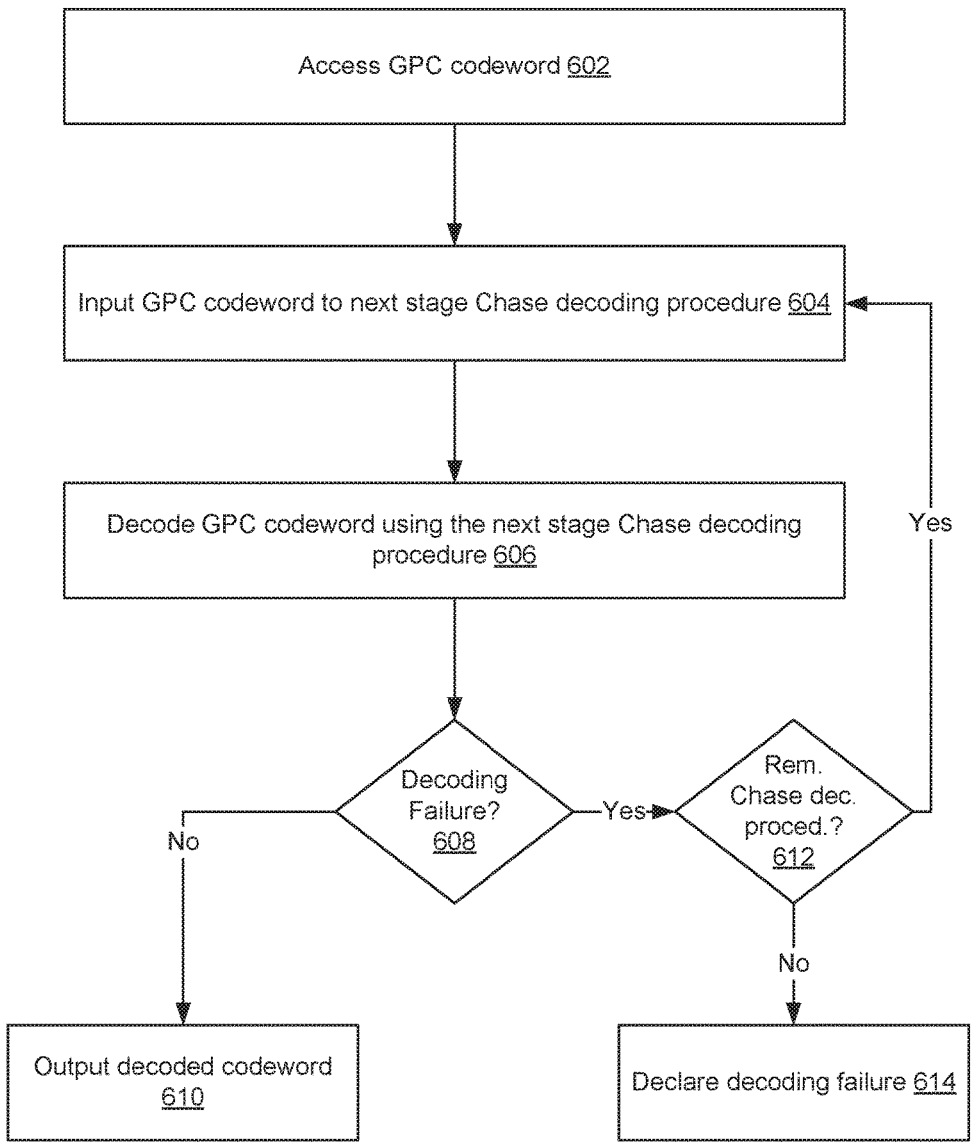
FIG. 6 illustrates an example flow for decoding a codeword based on a series of decoders, in accordance with certain embodiments of the present disclosure.
Figure 7:
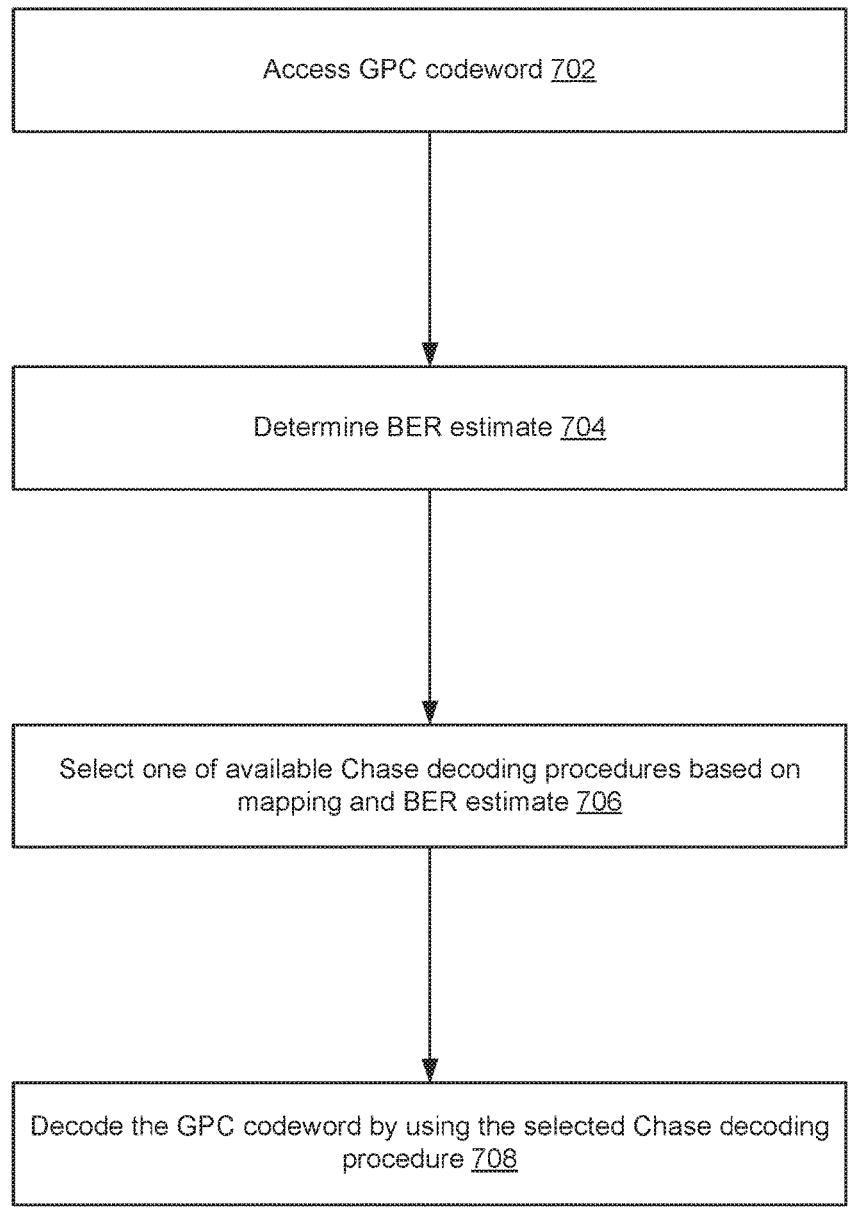
FIG. 7 illustrates an example flow for decoding a codeword based on parallel decoders, in accordance with certain embodiments of the present disclosure.

Turning to FIGS. 5-7, the figures illustrate example flows for decoding a codeword. A system, such as an ECC system or a decoding system within the ECC system, may be configured to perform the illustrative flows. Instructions for performing the operations of the illustrative flows can be stored as computer-readable instructions on a non-transitory computer-readable medium of the system. As stored, the instructions represent programmable modules that include code or data executable by a processor of the system. The execution of such instructions configures the system to perform the specific operations shown in the figures and described herein. While the operations are illustrated in a particular order, it should be understood that no particular order is necessary and that one or more operations may be omitted, skipped, and/or reordered. Further, some operations are similar. In the interest of clarity of explanation, description of the similar operations is not repeated.

FIG. 5 illustrates an example flow for decoding a codeword based on at least one of a plurality of decoders available on the system, in accordance with certain embodiments of the present disclosure. Each of the decoders implements a decoding procedure, such as a Chase decoding procedure. In turn, the different decoding procedures implement the same decoding algorithm, but use different values for decoding parameters of the decoding algorithm. The values are set for each decoder as a tradeoff between latency and BER.

The example flow starts at operation 502, where the system provides a plurality of Chase decoding procedures. For example, the system includes a combination of hardware, software, and firmware to host a plurality of soft decoders. Each decoder implements a Chase decoding procedure. The decoding parameters, including "L," "S" and any other applicable decoding parameters, are set to achieve a particular latency performance and a particular BER performance. The different decoders can be connected in series, as illustrated in FIG. 3, or can be provided in parallel, as illustrated in FIG. 4.

At operation 504, the system access a GPC codeword. For example, the system includes a storage device. The GPC codeword is read from the storage device. If multiple GPC codewords are also stored, these codewords can be similarly read.

At operation 506, the system identifies at least one of the plurality of Chase decoding procedures for decoding the GPC codeword (and, similarly, other read GPC codewords from the storage device). The identification depends on the configuration of the soft decoders. On one hand, if a series configuration is used, the system identifies the first soft decoder in the series and inputs the GPC codeword to that first soft decoder. If the decoding fails at the first soft decoder, the system then identifies the next soft decoder in the series and inputs the GPC codeword thereto, and so on a so forth. On the other hand, if a parallel configuration is used, the system selects one of the soft decoders based on a BER estimate and a mapping of BER ranges to the soft decoders. The GPC codeword is then input to only the selected soft decoder.

At operation 508, the system decodes the GPC codeword (and, similarly, the other read GPC codewords) by using the identified Chase decoding procedure(s). Here again, the decoding depends on the configuration of the soft decoders. In the case of the series configuration, the GPC codeword is decoded as an output from one of the soft decoders. If none of the soft decoders successfully decodes the GPC codeword, the system can declare a decoding failure. In the case of the parallel configuration, the GPC codeword is decoded as an output from the selected soft decoder only. If that soft decoder fails to decode the GPC codeword, the system can declare a decoding failure. Alternatively, the system can attempt to further decoder the GPC codeword by selecting and using a soft decoder that has a better BER performance. However, a latency penalty can be incurred for performing the additional decoding. Hence, in latency-sensitive product applications, the additional decoding can be skipped.

FIG. 6 illustrates an example flow for decoding a codeword based on a series of decoders, in accordance with certain embodiments of the present disclosure. In particular, the plurality of soft decoders are connected in series, as illustrated in FIG. 3.

The example flow starts at operation 602, where the system access a GPC codeword. This operation is similar to operation 502 of FIG. 5.

At operation 604, the system inputs the GPC codeword to a next stage Chase decoding procedure. For example, at the start of the decoding (e.g., the GPC codeword has not been decoded or provided as input to any of the soft decoders), the GPC codeword is input to the first soft decoder in the series. During the decoding, if a particular soft decoder fails to decode the GPC codeword, the GPC codeword becomes input to the next soft decoder in the series (e.g., to the second soft decoder if the first one failed to decode the GPC codeword).

At operation 606, the system decodes the GPC codeword using the next stage Chase decoding procedure. For example, the GPC codeword is decoded according to the decoding parameters available at that stage. The decoding parameters result in particular latency and BER performances.

At operation 608, the system determines whether a decoding failure occurred or not. This determination is an output of the soft decoder. If no failure occurred, operation 610 is performed where the system outputs the decoded codeword. In particular, the decoded codeword is an output of the soft decoder. If a failure occurred, operation 612 is performed where the system determines if there are any remaining Chase decoding procedures in the series. If so, the system loops back to operation 604, where the GPC codeword becomes input to the next soft decoder in the series. Otherwise, no remaining Chase decoding procedures exist and operation 614 is performed where the system declares a decoding failure.

FIG. 7 illustrates an example flow for decoding a codeword based on parallel decoders, in accordance with certain embodiments of the present disclosure. In particular, the plurality of soft decoders are provided in a parallel configuration, as illustrated in FIG. 4.

The example flow starts at operation 702, where the system access a GPC codeword. This operation is similar to operation 502 of FIG. 5.

At operation 704, the system determines a BER estimate. For example, information about the BER estimate is available from memory of the system. In another example, the system estimates the BER based on a weight vector "W" and the GPC codeword. The weight vector "W" can be available from the memory. The BER is estimated as a product of the weight vector "W" and the GPC codeword (or a plurality of GPC codewords that are to be decoded from the storage device).

At operation 706, the system selects one of the available Chase decoding procedures based on a mapping and the BER estimate. For example, the mapping associated BER ranges with the soft decoders and is available from the memory. The system compares the BER estimate to the BER ranges and selects the soft decoder associated with the BER range in which the BER estimate falls.

At operation 708, the system decodes the GPC codeword by using the selected Chase decoding procedure. For example, the GPC codeword is input to the selected soft decoder. A decoded codeword is an output of the selected soft decoder, unless the decoding fails. If the decoding fails, the system can declare a decoding failure.

FIG. 8 illustrates an example flow for configuring the system described in connection with FIGS. 5-7 to achieve a desired decoding performance, such as a desired overall latency. The configuring generally includes setting values for decoding parameters and occurs prior to deploying or using the system for decoding codewords. For example, the system (or a design thereof) is configured in a development phase during which various simulations and design adjustments are possible.

The example flow starts at operation 802, where the number of Chase decoding procedures to implement on the system is identified. Each of the procedures can correspond to one stage of decoding. In general, the larger the number, the more complex the system becomes and the more SoC may be needed. In addition, a determination is made as to whether a series or parallel configuration should be used. This determination can depend on whether the BER estimate will be available to the system or not.

At operation 804, a first decoding latency is allocated from an overall decoding latency of the system to a Chase decoding procedure. For example, for a faster stage one soft decoder, a sixty microsecond latency may be allocated from an overall sixty-two second microsecond latency. Generally, the overall decoding latency is driven by the product application that the system needs to support.

At operation 806, decoding latencies of the Chase decoding procedure is simulated by varying the values of the decoding parameters of the Chase decoding procedure. For example, different values for the "L" and "S" parameters can be used to simulate the resulting decoding latency.

At operation 808, values are selected based on the simulation. For example, the particular values that resulted in a decoding latency equal to or smaller than the allocated decoding frequency are selected.

At operation 810, the BER performance of the Chase decoding procedure is simulated based on the selected values. For example, different training GPC codewords are decoded with the Chase decoding procedure having the selected values set for the decoding parameters. The BER performance is measured from this decoding. This performance can include a range of BERs that the Chase decoding procedure is expected to support.

At operation 812, a mapping is updated based on the simulated BER performance. For example, the mapping identifies the Chase decoding procedure (and, optionally, the values of the decoding parameters), and associates the Chase decoding procedure with the BER range that should be supported.

At operation 814, an adjusted latency for a next Chase decoding procedure is computed based on an allocated decoding latency to this next Chase decoding procedure and the simulated BER. The next Chase decoding procedure corresponds to the next soft decoder in the series in the parallel configuration. Similarly to operation 804, a decoding latency can be allocated to this decoder from the overall decoding latency. In particular, a remaining decoding latency is computed. For example, the remaining decoding latency is equal to the overall decoding latency minus the allocated decoding latency of the previous stage soft decoder. However, the allocated latency should be adjusted to reflect the fact that this decoder is only used if the decoding fails from the previous decoder (in the case of a series configuration) or is not used given some BER estimate (in the case of a parallel configuration). In an example, the adjusted latency is equal to the allocated decoding latency divided by the simulated average BER of the previous stage soft decoder. To illustrate, if the overall decoding latency is sixty-two microseconds, and the sixty microseconds were allocated to the first stage soft decoder with a simulated average BER of $1\ e^{-2}$, a two microsecond latency remains. In this example, one microsecond of this remaining decoding latency is allocated to the second stage decoder. Accordingly, the adjusted latency should be equal to $1\ e^{-2}$, the adjusted decoding latency is $1/1\ e^{-2}=100$ microseconds. This adjusted decoding latency is then used to set the values of the decoding parameters of the next decoding Chase procedure. Accordingly, the operations 804-814 are repeated for the next stage soft decoder(s), with a modification to operation 804 where the modification allocates a decoding latency from the remaining decoding latency and adjusts the allocation given BER of a previous stage soft decoder.

Figure 9:
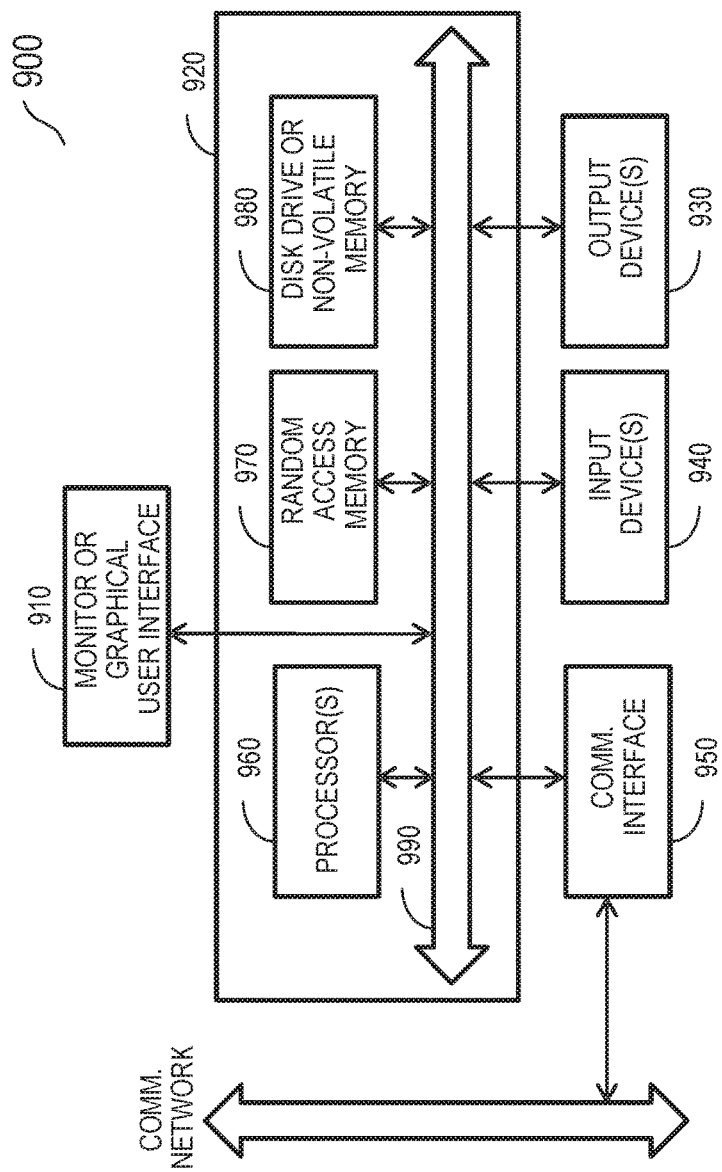
FIG. 9 describes one potential implementation of a system, which may be used according to one embodiment.

FIG. 9 describes one potential implementation of a system, which may be used according to one embodiment, such as the system 100 of FIG. 1. FIG. 9 is merely illustrative of an embodiment of the present disclosure and does not limit the scope of the disclosure as recited in the claims. In one embodiment, the system is a computer system 900 that typically includes a monitor 910, a computer 920, user output devices 930, user input devices 940, communications interface 950, and the like. The system 100 of FIG. 1 implements some or all of the components of the computer system 900.

As shown in FIG. 9, the computer 920 may include a processor(s) 960 that communicates with a number of peripheral devices via a bus subsystem 990. These peripheral devices may include the user output devices 930, the user input devices 940, the communications interface 950, and a storage subsystem, such as random access memory (RAM) 970 and disk drive 980.

The user input devices 930 include all possible types of devices and mechanisms for inputting information to the computer system 920. These may include a keyboard, a keypad, a touch screen incorporated into the display, audio input devices such as voice recognition systems, microphones, and other types of input devices. In various embodiments, the user input devices 930 are typically embodied as a computer mouse, a trackball, a track pad, a joystick, wireless remote, drawing tablet, voice command system, eye tracking system, and the like. The user input devices 930 typically allow a user to select objects, icons, text and the like that appear on the monitor 910 via a command such as a click of a button or the like.

The user output devices 940 include all possible types of devices and mechanisms for outputting information from the computer 920. These may include a display (e.g., the monitor 910), non-visual displays such as audio output devices, etc.

The communications interface 950 provides an interface to other communication networks and devices. The communications interface 950 may serve as an interface for receiving data from and transmitting data to other systems. Embodiments of the communications interface 950 typically include an Ethernet card, a modem (telephone, satellite, cable, ISDN), (asynchronous) digital subscriber line (DSL) unit, FireWire interface, USB interface, and the like. For example, the communications interface 950 may be coupled to a computer network, to a FireWire bus, or the like. In other embodiments, the communications interfaces 950 may be physically integrated on the motherboard of the computer 920, and may be a software program, such as soft DSL, or the like.

In various embodiments, the computer system 900 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 920 includes one or more Xeon microprocessors from Intel as the processor(s) 960. Further, one embodiment, the computer 920 includes a UNIX-based operating system.

The RAM 970 and the disk drive 980 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 970 and the disk drive 980 may be configured to store the basic programming and data constructs that provide the functionality of the present disclosure.

Software code modules and instructions that provide the functionality of the present disclosure may be stored in the RAM 970 and the disk drive 980. These software modules may be executed by the processor(s) 960. The RAM 970 and the disk drive 980 may also provide a repository for storing data used in accordance with the present disclosure.

The RAM 970 and the disk drive 980 may include a number of memories including a main random access memory (RAM) for storage of instructions and data during program execution and a read only memory (ROM) in which fixed non-transitory instructions are stored. The RAM 970 and the disk drive 980 may include a file storage subsystem providing persistent (non-volatile) storage for program and data files. The RAM 970 and the disk drive 980 may also include removable storage systems, such as removable flash memory.

The bus subsystem 990 provides a mechanism for letting the various components and subsystems of the computer 920 communicate with each other as intended. Although the bus subsystem 990 is shown schematically as a single bus, alternative embodiments of the bus subsystem may utilize multiple busses.

FIG. 9 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A system for codeword decoding, comprising:
    a processor;
    a memory communicatively coupled with the processor and storing instructions that, upon execution by the processor, cause the system to at least:
        access a generalized product code (GPC) codeword; and
        decode the GPC codeword by using at least one of a plurality of Chase decoding procedures available on the system, wherein:
            the plurality of Chase decoding procedures comprise a first Chase decoding procedure and a second Chase decoding procedure that are configured based on a set of decoding parameters, the set of decoding parameters comprising a first parameter that limits a first total number of bits available for flipping across multiple flips, the set of decoding parameters further comprising a second parameter that limits a second total number of bits available for flipping in a single flip,
            the first Chase decoding procedure is configured according to first values for the set of decoding parameters, the first values specified for at least the first total number and the second total number of the second decoding Chase decoding procedure,
            the second Chase decoding procedure is configured according to second values for the set of decoding parameters, the second values specified for at least the first total number and the second total number of the second decoding Chase decoding Procedure,
at least one of the first total number or the second total number is defined differently for the first Chase decoding procedure and the second Chase decoding procedure based on the second values being different from the first values, and
the first Chase decoding procedure has a smaller latency and a higher bit error rate (BER) relative to the second Chase decoding procedure based on the first values and the second values for the set of decoding parameters.

2. The system of claim 1, the first total number is "L" bits of the GPC codeword available for flipping across the multiple flip by a Chase (L,S) decoding procedure.

3. The system of claim 2, wherein the second total number is "S" bits of the GPC codeword available for flipping in the single flip by the Chase (L,S) decoding procedure.

4. The system of claim 3, wherein a first combination of the first parameter and the second parameter for the first Chase decoding procedure has a smaller number of possible bit flips than a second a second combination of the first parameter and the second parameter for the second Chase decoding procedure.

5. The system of claim 1, wherein the first Chase decoding procedure and the second Chase decoding procedure are provided in series.

6. The system of claim 5, wherein the GPC codeword is input to the first Chase decoding procedure, and wherein:
if the first Chase decoding procedure fails to decode the GPC codeword, the GPC codeword is input to the second Chase decoding procedure and is decoded according to the second Chase decoding procedure, and
if the first Chase procedure decoding succeeds in decoding the GPC codeword, the GPC codeword is decoded according to the first Chase decoding procedure and is not input to the second Chase decoding procedure.

7. The system of claim 5, wherein the first values for the set of decoding parameters are set for the first Chase decoding procedure based on:
an allocation of a first latency from an overall latency of the system to the first Chase decoding procedure;
a simulation of latencies of the first Chase decoding procedure, wherein the simulation varies the first values; and
a selection of particular values from the varied first values based on the simulation of the latencies, wherein the particular values correspond to a simulated latency that is equal to or smaller than the first latency.

8. The system of claim 7, wherein the second values for the set of decoding parameters are set for the second Chase decoding procedure based on:
a simulation of a first BER of the first Chase decoding procedure, wherein the first BER corresponds to the particular values set as the first values of the first Chase decoding procedure;
a computation of a remaining latency based on the overall latency and the first latency; and
an allocation of a second latency from the remaining latency to the second Chase decoding procedure; and
a computation of an adjusted latency, wherein the computation of the adjusted latency uses the first BER of the first Chase and the second latency.

9. The system of claim 1, wherein the first Chase decoding procedure and the second Chase decoding procedure are provided in parallel.

10. The system of claim 9, wherein only one of the first Chase decoding procedure or the second Chase decoding procedure is selected for the decoding of the GPC codeword.

11. The system of claim 10, wherein the instructions further cause the system to at least select the first Chase decoding procedure or the second Chase decoding procedure based on a BER estimate and a mapping of BER ranges to a plurality of Chase decoding procedures available on the system, wherein the plurality of Chase decoding procedures comprises the first Chase decoding procedure and the second Chase decoding procedure.

12. The system of claim 11, wherein the first values for the set of decoding parameters are set for the first Chase decoding procedure based on:
an allocation of a first latency from an overall latency of the system to the first Chase decoding procedure;
a simulation of latencies of the first Chase decoding procedure, wherein the simulation varies the first values;
a selection of particular values from the varied first values based on the simulation of the latencies, wherein the particular values correspond to a simulated latency that is equal to or smaller than the first latency;
a simulation of a first BER of the first Chase decoding procedure, wherein the first BER corresponds to the particular values set as the first values of the first Chase decoding procedure; and
an update to the mapping of BER ranges based on a simulation of the first BER.

13. A method for codeword decoding, the method comprising:
accessing, by a system, a generalized product code (GPC) codeword; and
decoding, by the system, the GPC codeword by using at least one of a plurality of Chase decoding procedures available on the system, wherein:
the plurality of Chase decoding procedures comprise a first Chase decoding procedure and a second Chase decoding procedure that are configured based on a set of decoding parameters, the set of decoding parameters comprising a first parameter that limits a first total number of bits available for flipping across multiple flips, the set of decoding parameters further comprising a second parameter that limits a second total number of bits available for flipping in a single flip,
the first Chase decoding procedure is configured according to first values for the set of decoding parameters, the first values specified for at least the first total number and the second total number of the second decoding Chase decoding procedure,
the second Chase decoding procedure is configured according to second values for the set of decoding parameters, the second values specified for at least the first total number and the second total number of the second decoding Chase decoding procedure,
at least one of the first total number or the second total number is defined differently for the first Chase decoding procedure and the second Chase decoding procedure based on the second values being different from the first values, and
the first Chase decoding procedure has a smaller latency and a higher bit error rate (BER) relative to the second Chase decoding procedure based on the first values and the second values for the set of decoding parameters.

14. The method of claim 13, wherein the first Chase decoding procedure and the second Chase decoding procedure are available on the system in series, wherein the GPC codeword is input to the first Chase decoding procedure, and wherein:
if the first Chase decoding procedure fails to decode the GPC codeword, the GPC codeword is input to the second Chase decoding procedure and is decoded according to the second Chase decoding procedure, and
if the first Chase procedure decoding succeeds in decoding the GPC codeword, the GPC codeword is decoded according to the first Chase decoding procedure and is not input to the second Chase decoding procedure.

15. The method of claim 13, wherein the first Chase decoding procedure and the second Chase decoding procedure are available on the system in parallel, and wherein only one of the first Chase decoding procedure or the second Chase decoding procedure is selected for the decoding of the GPC codeword.

16. The method of claim 15, wherein the operations further comprise selecting, by the system, the first Chase decoding procedure or the second Chase decoding procedure based on a BER estimate and a mapping of BER ranges to the plurality of Chase decoding procedures available on the system.

17. A non-transitory computer-readable storage medium storing instructions that, upon execution by a processor of a system, configure the system to perform operations comprising:
accessing a generalized product code (GPC) codeword; and
decoding the GPC codeword by using at least one of a plurality of Chase decoding procedures available on the system, wherein:
the plurality of Chase decoding procedures comprise a first Chase decoding procedure and a second Chase decoding procedure that are configured based on a set of decoding parameters, the set of decoding parameters comprising a first parameter that limits a first total number of bits available for flipping across multiple flips, the set of decoding parameters further comprising a second parameter that limits a second total number of bits available for flipping in a single flip,
the first Chase decoding procedure is configured according to first values for the set of decoding parameters, the first values specified for at least the first total number and the second total number of the second decoding Chase decoding procedure,
the second Chase decoding procedure is configured according to second values for the set of decoding parameters, the second values specified for at least the first total number and the second total number of the second decoding Chase decoding procedure,
at least one of the first total number or the second total number is defined differently for the first Chase decoding procedure and the second Chase decoding procedure based on the second values being different from the first values, and
the first Chase decoding procedure has a smaller latency and a higher bit error rate (BER) relative to the second Chase decoding procedure based on the first values and the second values for the set of decoding parameters.

18. The non-transitory computer-readable storage medium of claim 17, wherein the first Chase decoding procedure and the second Chase decoding procedure are available on the system in series, wherein the GPC codeword is input to the first Chase decoding procedure, and wherein:
if the first Chase decoding procedure fails to decode the GPC codeword, the GPC codeword is input to the second Chase decoding procedure and is decoded according to the second Chase decoding procedure, and
if the first Chase procedure decoding succeeds in decoding the GPC codeword, the GPC codeword is decoded according to the first Chase decoding procedure and is not input to the second Chase decoding procedure.

19. The non-transitory computer-readable storage medium of claim 17, wherein the first Chase decoding procedure and the second Chase decoding procedure are available on the system in parallel, and wherein only one of the first Chase decoding procedure or the second Chase decoding procedure is selected for the decoding of the GPC codeword.

20. The non-transitory computer-readable storage medium of claim 19, wherein the instructions further configure the system to at least select the first Chase decoding procedure or the second Chase decoding procedure based on a BER estimate and a mapping of BER ranges to the plurality of Chase decoding procedures available on the system.

* * * * *